United States Patent [19]

Adkins

[11] Patent Number: 4,578,339
[45] Date of Patent: Mar. 25, 1986

[54] PHOTOSENSITIVE IMAGING SYSTEM EMPLOYING OIL-CONTAINING MICROCAPSULES

[75] Inventor: David G. Adkins, Chillicothe, Ohio

[73] Assignee: The Mead Corporation, Dayton, Ohio

[21] Appl. No.: 643,565

[22] Filed: Aug. 23, 1984

[51] Int. Cl.$^4$ .................... G03C 1/68; G03C 5/54; G03C 7/00; B01J 13/02

[52] U.S. Cl. .................... 430/138; 252/600; 427/213.31; 428/402.2; 428/402.21; 428/402.24; 430/211

[58] Field of Search .................... 430/138, 211; 427/213.31; 428/402.2, 402.21, 404.24; 252/600

[56] References Cited

U.S. PATENT DOCUMENTS

| | | | |
|---|---|---|---|
| 3,113,148 | 12/1963 | Miller | 430/138 |
| 4,138,362 | 2/1979 | Vassiliades et al. | 430/138 X |
| 4,399,209 | 8/1983 | Sanders et al. | 430/138 |
| 4,416,966 | 11/1983 | Sanders et al. | 430/138 |
| 4,440,846 | 4/1984 | Sanders et al. | 430/138 |
| 4,483,912 | 11/1984 | Sanders | 430/138 |
| 4,489,151 | 12/1984 | Sanders et al. | 430/138 |
| 4,501,809 | 2/1985 | Hiraismi et al. | 430/138 |

Primary Examiner—John E. Kittle
Assistant Examiner—Mukund J. Shah
Attorney, Agent, or Firm—Biebel, French & Nauman

[57] ABSTRACT

A photosensitive transfer imaging system comprising an imaging sheet and a developer sheet; the imaging sheet incudes a photographic support, a layer of photosensitive microcapsules on one surface of the support wherein the microcapsules have a discrete capsule wall and contain a chromogenic material and a photosensitive composition such as a polyethylenically unsaturated compound and a photoinitiator; the developer sheet includes a support member and a layer of a developer composition such as a salicylic acid salt; the imaging sheet and/or the developer sheet additionally includes a plurality of microcapsules which contain an oil in which the chromogenic material is soluble; images are formed by image-wise exposing the imaging sheet to actinic radiation and rupturing the microcapsules in contact with the developer sheet whereupon the chromogenic material is image-wise transferred to the developer sheet.

16 Claims, No Drawings

PHOTOSENSITIVE IMAGING SYSTEM EMPLOYING OIL-CONTAINING MICROCAPSULES

BACKGROUND OF THE INVENTION

The present invention relates to an improved transfer imaging system of the type in which a layer of microcapsules having a photosensitive internal phase is provided on a support and image-wise exposed to actinic radiation.

U.S. Pat. No. 4,399,209 to The Mead Corporation describes a transfer imaging system in which an imaging sheet comprising a support which carries a layer of photosensitive microcapsules containing a color-forming agent is image-wise exposed to actinic radiation, assembled with a developer sheet, and subjected to a uniform rupturing force. This causes the microcapsules to rupture in the unexposed areas and image-wise release the color-forming agent which migrates to the developer sheet and reacts with the developer to form an image.

In some applications, due to the high viscosity of the internal phase of the microcapsules used in the aforementioned transfer imaging systems, the images that are obtained develop slowly and have low density. While one solution to this problem would be to add a diluent to the internal phase of the microcapsules to reduce its viscosity, in many instances, the addition of the diluent reduces the film speed of the system. Accordingly, this does not represent an effective solution to the problem.

SUMMARY OF THE INVENTION

A principle object of the present invention is to provide a transfer imaging system of the aforementioned type which provides improved image density and exhibits a faster, more rapid, development rate.

A more particular object of the present invention is to provide a transfer imaging system having improved image density and a more rapid development rate without reducing the inherent film speed of the photosensitive microcapsules.

In accordance with the present invention, image density and development rate are improved by including on the imaging sheet and/or the developer sheet of a transfer imaging system, oil-containing microcapsules, i.e., microcapsules containing, as the internal phase, an oil in which the chromogenic material released by the photosensitive microcapsules is soluble. Following development and upon subjecting the imaging sheet-developer sheet assembly to a uniform rupturing force, the oil-containing microcapsules rupture and release the oil. The oil mixes with the internal phase released from the photosensitive microcapsules, reduces its viscosity and thereby increases the mobility of the chromogenic material and improves the interaction between the developer and the chromogenic material on the developer sheet. By enhancing the mobility of the internal phase released from the photosensitive, chromogenic material-containing microcapsules, more chromogenic material is transferred to the developer sheet, the impregnation of the developer composition by the chromogenic material is enhanced and a more intense image is obtained.

The oil used in the oil-containing microcapsules may be photosensitive or non-photosensitive. Where the oil is photosensitive, the release of the oil is restricted to the areas in which the image is formed. Where the oil is not photosensitive, the oil is uniformly released. In some embodiments, uniformly releasing the oil may lead to some background coloring as a result of unencapsulated chromogenic material transferring to the developer sheet and reacting. Furthermore, in certain full color imaging systems where a plurality of microcapsules containing cyan, magenta and yellow color formers image-wise release their contents to the developer sheet, the uniform release of additional oil to the sheet may create smudging and similar problems.

Accordingly, the present invention provides a transfer imaging system comprising an imaging sheet and a developer sheet wherein the imaging sheet includes a support, a layer of photosensitive microcapsules on one surface of the support, the microcapsules having a discrete capsule wall encapsulating, as the internal phase, a chromogenic material and a photosensitive composition which undergoes a change in viscosity upon exposure to actinic radiation; the developer sheet including a support and a layer of a developer material on one surface of that support, the developer being capable of reacting with the chromogenic material and producing a color image; at least one of the imaging sheet and the developer sheet carrying a plurality of oil-containing microcapsules on the surface thereof carrying the photosensitive microcapsules or the developer material, the oil being an oil which dissolves the chromogenic material; the imaging system being capable of forming images by image-wise exposing the imaging sheet to actinic radiation, assembling the imaging sheet and the developer sheet, and subjecting the photosensitive microcapsules to a uniform rupturing force, whereupon the photosensitive microcapsules image-wise release the chromogenic material to the developer sheet where the chromogenic material and the developer sheet react to form an image and the oil-containing microcapsules rupture and release the oil thereby enhancing image formation.

In accordance with a preferred embodiment of the invention, the photosensitive microcapsules contain a radiation curable composition, i.e., a composition which undergoes an increase in viscosity upon exposure.

In a still more preferred embodiment of the invention, the chromogenic material is a substantially colorless electron donating compound, the developer is an electron accepting compound, and the rupturing force is pressure.

DETAILED DESCRIPTION OF THE INVENTION

The function of the oil-containing microcapsules in the imaging system of the present invention is to release oil upon development which mixes with the internal phase released from the photosensitive, chromogenic material containing microcapsules and reduces its viscosity. This enhances the ability of the chromogenic material to move to the developer sheet and form an image. The oil contained in the oil-containing microcapsules is characterized in that it has a viscosity less than the viscosity of the internal phase of the photosensitive, chromogenic material-containing microcapsules. Typically, the oil has a viscosity less than about 150 cps at 23° C. and, more preferably, less than about 35 cps at 23° C.

The chromogenic material must be soluble in the oil. Useful oils, therefore, are most typically weakly polar solvents and, still more particularly, solvents which are characterized by an ability to dissolve Crystal Violet Lactone in an amount greater than 0.5 wt. percent at 23° C.

Higher boiling oils (e.g., oils having boiling points above 170° C. and preferably in the range of 180°-300° C.) are typically used in the present invention. Representative examples of these oils include oils conventionally used as "carrier oils" in the carbonless pressure-sensitive paper art. Alkylated biphenyls (e.g., monoisopropylbiphenyl) polychlorinated biphenyls (environmentally hazardous), castor oil, mineral oil, deodorized kerosense, naphthenic mineral oils, dibutyl phthalate, dibutyl fumerate, brominated paraffins, etc.

The oils used in the present invention can also consist of or be a mixture including a photosensitive oil, such as ethylenically unsaturated compounds or prepolymers, having the aforesaid viscosity and solubility characteristics. Typical examples of oils of this type are acrylic and methacrylic esters or polyhydric alcohols and acrylic and methacrylic modified polyesters and polethers. Specific examples are listed below with respect to the photosensitive composition contained in the photosensitive, chromogenic material containing microcapsules. Where the oil-containing microcapsules include a photosensitive oil, the essential distinction between the oil-containing microcapsule and the photosensitive, chromogenic material containing microcapsule is that the oil-containing microcapsule does not contain a chromogenic material and does not contain other additives which are designed to improve photographic performance but which raise the viscosity of the internal phase.

The oil-containing microcapsules can be employed on the imaging sheet and/or the developer sheet of the transfer imaging system. When used on the imaging sheet, they can be admixed with the photosensitive, chromogenic material containing microcapsules or placed in a separate, contiguous layer overcoating the photosensitive, chromogenic material containing microcapsules such that the oil-containing microcapsules are interposed between the photosensitive, chromogenic material containing microcapsules and the developer sheet upon development. Depending upon whether the oil-containing microcapsules include a photosensitive oil, they uniformly or image-wise release the oil upon development.

As previously stated, the imaging system is developed by subjecting the microcapsules to a uniform rupturing force. Preferably this is accomplished by the application of pressure, e.g, by passing the imaging sheet and the developer sheet with their reactive surfaces in contact through the nip between a pair of pressure rollers. However, other means such as ultrasonic vibration, heat, etc., can also be used. In accordance with commonly assigned and recently allowed U.S. Application Ser. No. 397,681, filed July 13, 1982, a so-called burnishing action is used.

The imaging sheet and the developer sheet of the present invention can be prepared by following the teachings in U.S. Pat. No. 4,399,209, which is hereby incorporated by reference. Full color transfer imaging systems can be prepared by following the teachings in commonly assigned U.S. Applications Ser. No. 339,917, filed Jan. 18, 1982 and Ser. No. 620,994, filed June 15, 1984. These teachings are also incorporated herein by reference. The system can be imaged by following teachings also found in the aforementioned documents.

Both reflection and direct transmission imaging can be used in the present invention.

Photosensitive compositions which are useful in the photosensitive chromogenic material containing microcapsules include compositions which are curable by free radical initiated, addition polymerization or crosslinking. The most common examples of such compositions are compositions which contain an ethylenically unsaturated compound, e.g., a compound containing one or more terminal or pendant vinyl or allylic groups. Such compounds are well known in the art and include acrylic and methacrylic esters of polyhydric alcohols such as trimethylolpropane, pentaerythritol, and the like. Representative examples include ethylene glycol diacrylate, ethylene glycol dimethacrylate, trimethylopropane triacrylate (TMPTA), trimethylolpropane trimethacrylate (TMPTMA), pentaerythritol tetraacrylate, pentaerythritol tetramethacrylate, hexanediol-1,6-dimethacrylate, diethyleneglycol dimethacrylate, and dipentaerythritol hydroxypentaacrylate. Commercially available photopolymers such as acrylate and methacrylate terminated polyesters and polyethers are also useful in the present invention. Certain photosoftenable compositions such as compositions which undergo a decrease in molecular weight or viscosity upon exposure (photolysis) are also useful in the present invention to provide a negative-working process.

The radiation sensitive compositions used in the present invention usually include a photoinitiator or a photoinitiator system in which a sensitizer is used alone or with a hydrogen donor. An absorber (such as an ultraviolet absorber) may also be used to adjust the sensitivity of the photosensitive composition. Photoinitiators which generate free radicals upon photochemical cleavage (homolytic initiators) such as certain benzoin ethers and which function via hydrogen abstraction are both useful. Preferred initiators are soluble in the radiation sensitive composition. Diaryl ketone derivatives and benzoin alkyl ethers are particularly useful. Specific examples of useful initiators include benzophenone, Michler's ketone, benzoin methyl ether, and 2,2'-dimethoxy-2-phenyl-acetophenone, isopropylxanthone, isopropylthioxanthone, and ethyl para-dimethylaminobenzoate, etc. A preferred sensitizer is a ketocoumarin.

The photoinitiator is present in the photosensitive composition in an amount effective to initiate polymerization or crosslinking. For example, isopropylthioxanthone is typically present in an amount up to about 10% by weight based on the weight of the photocrosslinkable or photopolymerizable material present in the photosensitive composition. The exact amount of photoinitiator used will vary with the nature of the photosensitive composition. It is also possible to reduce the exposure time by incorporating a scattering agent such as magnesium oxide in the capsule layer. The scattering agent increases the mean free path and thereby intensifies exposure.

Ultraviolet sensitive microcapsules are generally preferred because they can be handled in room light for short periods of time. They are also useful for copying from a CRT screen. One disadvantage of ultraviolet sensitive systems, however, is that many printed documents are on a paper which includes optical brighteners which absorb ultraviolet radiation. Accordingly, to copy printed documents, blue light sensitive systems are advantageous. These systems can be made room light handleable by incorporating conventional screening agents into the microcapsules.

In accordance with certain embodiments of the present invention (particularly those embodiments in which the photosensitive composition contains a photopolymerizable monomer such as TMPTA) the photosensitive composition may include an oligomeric and/or a polymeric material to further increase the film speed of the microcapsules. Typically, these materials range from about 800 to 3,000 in average molecular weight in the case of oligomers and up to 40,000 in molecular weight in the case of polymers. The oligomer or polymer may be reactive, i.e., curable or polymerizable by free radical initiated polymerization, or not reactive. In both cases, it enhances the film speed by increasing the rate with which the viscosity of the composition reaches a level at which the microcapsules can be differentially ruptured.

Representative examples of some commercially available oligomers which are useful in the present invention include Ebecryl 240, Ebecryl 270, Ebecryl 810 (Virginia Chemicals Inc.); DER 662, DER 663U, DER 664U (Dow Chemical Co.); Cargill 1570 (Cargill); Uvithane 893 (Morton Thiokol Inc.); Diallyl-o-phthalate prepolymer (Polysciences); polyvinylpyrrolidone (GAF).

In some cases it is advantageous to include a polythiol in the photosensitive composition to improve sensitivity (film speed). Useful polythiols contain 2 or more terminal or pendant -SH groups. Examples of polythiols that are desirable for use in the present invention are esters of thioglycolic acid and $\beta$-mercaptopropionic acid. Representative examples of the preferred polythiols include ethylene glycol bis(thioglycolate), ethylene glycol bis($\beta$-mercaptopropionate), trimethylolpropane tris(thioglycolate), pentaerythritol tetrakis(thioglycolate) and the most preferred pentaerythritol tetrakis($\beta$-mercaptopropionate), dipentaerythritol hexa($\beta$-mercaptopropionate), and trimethylolpropane tris($\beta$-mercaptopropionate), and mixtures thereof. These compounds are commercially available. Certain polymeric polythiols such as polypropylene ether glycol bis($\beta$-mercaptopropionate) which is prepared by esterification of polypropylene ether glycol may also be useful.

One example of a chromogenic material useful in the invention is a colorless electron donating compound. Representative examples of such compounds include substantially colorless compounds having in their partial skeleton a lactone, a lactam, a sultone, a spiropyran, an ester of an amido structure such as triarylmethane compounds, bisphenylmethane compounds, xanthene compounds, fluorans, thiazine compounds, spiropyran compounds and the like. Crystal Violet Lactone and Copikem X, IV XI, and XX (Hilton-Davis Co.) are often used alone or in combination as color precursors in the present invention.

Illustrative examples of color developers useful in conjunction with the electron donating type color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5-di-tert-butyl-salicylate (see U.S. Pat. Nos. 3,864,146 and 3,934,070), zinc 3,5-di($\alpha$-methylbenzyl) salicylate oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

Images can also be formed using as the image-forming agent, a chelating agent which reacts with a metal salt, as a developer, to generate a color image upon being released from the microcapsules. Some typical examples of useful image-forming pairs of this type are nickel nitrate and N,N' bis(2-octanoyloxyethyl)dithiooxamide, and alum [FE(III)] and yellow prussiate.

Substantially any color-forming agent which can be encapsulated and which will react with a developer material to form an image can be used in the present invention. Furthermore, either the color former or the color developer may be associated with the microcapsules. It is not always necessary to encapsulate the color former, as is the conventional practice.

The internal phase of the photosensitive chromogenic material containing microcapsules may also include a diluent oil. Inclusion of the oil can improve half tone gradation in visual images. Preferred diluent oils are weakly polar solvents having boiling points above 170° C. and preferably in the range of 180° to 300° C. Examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls and kerosense are generally less toxic and preferred. The amount of diluent oil incorporated in the microcapsules will depend upon the photographic characteristics that are desired in the photosensitive materials. Typically, the diluent oil is used in an amount of approximately 10 to 20% by weight based on the weight of the internal phase.

The photosensitive microcapsules of the present invention are easily formed using known encapsulation techniques. The photosensitive composition and associated agents can be encapsulated in hydrophilic wall-forming materials such as gelatin-type materials (see U.S. Pat. Nos. 2,730,456 and 2,800,457 and Green et al) including gum arabic, polyvinyl alcohol, carboxy-methyl-cellulose; resorcinol-formaldehyde wall formers (see U.S. Pat. No. 3,755,190 to Hart et al); isocyanate wall-formers (see U.S. Pat. No. 3,914,511 to Vassiliades); isocyanate-polyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); and melamineformaldehyde resin and hydroxypropyl cellulose (see commonly assigned U.S. Pat. No. 4,025,455 to Shackle).

The mean size of the microcapsules of the present invention generally ranges from approximately 1 to 25 microns. As a general rule, image resolution improves as capsule size decreases except that if the capsule size is too small, the capsules may disappear in the pore or fiber structure of some substrates.

The chromogenic material is used in an amount sufficient to produce a visible image of the desired density upon reaction with a developer or upon transfer. In general, the chromogenic material is present in an amount of approximately 0.5 to 25% by weight based on the weight of the photopolymerizable or photocross-linkable species. A preferred range is about 2 to 10% by weight.

The most common substrate for the image-receiving sheet is paper. The paper may be a commercial impact raw stock, or a special grade paper such as cast-coated paper or chrome-rolled paper. Transparent substrates such as polyethylene terephthalate and translucent substrates can also be used in this invention.

The present invention is illustrated in more detail by the following non-limiting example.

EXAMPLE 1 a. Imaging Sheet Preparation

Photosensitive microcapsules were prepared by the procedure outlined below using the following solution as the internal phase:

| Solution | Parts |
| --- | --- |
| Dipentaerythritol monohydroxy pentaacrylate | 17 |
| Trimethylolpropane triacrylate | 33 |
| Quanticure ITX (Ward-Blenkinsop, Ltd.) | 2 |
| 2,4,6-N,N—pentamethylaniline | 2.6 |
| SF-50 (Union Carbide Corporation) | 1.6 |
| N-100 (Desmodur division of Mobay Chemical Corp.) | |

1. Into a 1200 ml stainless steel beaker, 416 g water and 99.2 g isobutylene maleic anhydride copolymer (18 %) are weighed.

2. The beaker is clamped in place on a hot plate under an overhead mixer. A six-bladed, 45° pitch, turbine impeller is used on the mixer.

3. After thoroughly mixing, 12.4 g pectin is slowly sifted into the beaker. This mixture is stirred for 20 minutes.

4. The pH is adjusted to 4.0 using a 20% solution of $H_2SO_4$, and 0.4 g Quadrol (2-hydroxypropyl ethylenediamine with propylene oxide from BASF) is added.

5. The mixer is turned up to 3000 rpm and the internal phase is added over a period fo 10–15 seconds. Emulsification is continued for 10 minutes.

6. At the start of emulsification, the hot plate is turned up so heating continues during emulsification.

7. After 10 minutes, the mixing speed is reduced to 2000 rpm and 66.4 g urea solution (50% w/w), 3.2 g resorcinol in 20 g water, formaldehyde (37%), and 2.4 g ammonium sulfate in 40 ml water are added at two-minute intervals.

8. The beaker is covered with foil and a heat gun is used to help bring the temperature of the preparation of 65° C. When 65° C. is reached, the hot plate is adjusted to maintain this temperature for a two to three hour cure time during which the capsule walls are formed.

9. After curing, the heat is turned off and the pH is adjusted to 9.0 using a 20% NaOH solution.

10. Dry sodium bisulfite (11.2 g) is added and the capsule preparation is cooled to room temperature.

Capsule preparations (10 g) obtained as outlined above were mixed with 8 g of 10% Triton X-100 (Rohm & Hass Company) in water and 2 g of 10% Klucel L (Hercules, Inc.) and the resultant mixture was coated on 80 lb Black & White Glossy (The Mead Corporation) with a number 12 wire-wound rod and dried at 90° C. for ½ hour.

b. Developer Sheet Preparation (Comparison) A mixture of 852 g water, 250 g 25% Tamol 731 (Rohm & Haas Company), 75 g HT clay, 1000 g KC-11 (a synthetic developer manufactured by Fuji Photo Film Company, Ltd.), 15 g Calgon T (Calgon, Inc.) 30 g Dequest 2006 (Monsanto Co.) was ground to a particle size less than 5 microns. To this mixture was added 25 parts HT clay and 10 parts Dow 501 latex per 65 parts of the mixture. The resultant material was coated with a #10 Meyer bar on 80 lb Black and White Enamel base stock at 30 to 35% solids.

(Invention) A developer sheet was prepared in accordance with the present invention by following the procedure outlined above and adding 20% by weight oil containing microcapsules to the developer composition. These capsules were prepared by the procedure outlined above except the internal phase consisted of monoisopropylbenzene (MIPB) containing a small amount (2 parts) P-vanillin to mask the odor.

Two imaging sheets prepared as above were exposed to a Kratos 1000 W source equipped with a monochromator having a 20 nm band pass. The sheets were exposed 8 seconds through a $\sqrt{2}$ step wedge.

The sheets were developed by passing them through the nip between two pressure rollers in contact with the developer sheets described above. Images of the step wedge were formed on the developer sheets. The comparison sheet exhibited an initial density of 0.4 and provided a near maximum density of 0.71 in 4 minutes. The developer sheet of the present invention exhibited an initial density of 0.60 are exhibited a density of 0.72 in 1 minute thus demonstrating the enhanced development rate which the oil containing capsules provide.

Having described the invention in detail and by reference to specific embodiments thereof, it will be apparent that numerous modifications and variations are possible without departing from the spirit and scope of the following claims.

What is claimed is:

1. A photosensitive transfer imaging system comprising an imaging sheet and a developer sheet;
    said imaging sheet including:
    a photographic support;
    a layer of photosensitive microcapsules on one surface of said support;
    said microcapsules having a discrete capsule wall which encapsulates, as a first internal phase, a chromogenic material, and a photosensitive composition which undergoes a change in viscosity upon exposure to actinic radiation;
    said developer sheet including;
    a support member, and
    a layer of a developer composition on one surface of said support member,
    said developer composition being capable of reacting with said chromogenic material and generating a color image;
    at least one of said imaging sheet and said developer sheet carrying a plurality of oil-containing microcapsules co-deposited on the reactive surface thereof with said photosensitive microcapsules or said developer material, said oil-containing micrcapules having a discrete capsule wall which encapsulates a second internal phase, said second internal phase consisting essentially of an oil in which said chromogenic material is soluble, said oil having a viscosity less than the viscosity of said first internal phase;
    said imaging system being capable of forming images by image-wise exposing said imaging sheet to actinic radiation, assembling said imaging sheet and said developer sheet with their reactive surfaces in contact, and subjecting said photosensitive microcapsules to a uniform rupturing force, said photosensitive microcapsules thereby image-wise releasing said first internal phase containing said chromogenic material to said developer sheet where said chromogenic material and said developer react to form an image; and said oil-containing microcapsules rupturing and releasing said second internal phase, said second internal phase thereupon mixing with said first internal phase and reducing the viscosity of said first internal phase and thereby enhancing image formation.

2. The imaging system of claim 1 wherein said photosensitive composition is a photohardenable composition.

3. The imaging system of claim 2 wherein said chromogenic material is a substantially colorless electron donating compound and said developer material is an electron accepting compound.

4. The imaging system of claim 1 wherein said uniform rupturing force is pressure.

5. The imaging system of claim 4 wherein said oil-containing microcapsules are co-deposited on the surface of said imaging sheet with said photosensitive microcapsules.

6. The imaging system of claim 4 wherein said oil-containing microcapsules are co-deposited on said developer sheet with said developer composition.

7. The imaging system of claim 5 wherein said oil-containing microcapsules are present on said imaging sheet in the same layer as said photosensitive microcapsules.

8. The imaging system of claim 5 wherein said oil-containing microcapsules are present in a layer overlying said layer containing said photosensitive microcapsules.

9. The imaging system of claim 5 wherein said oil is photosensitive.

10. The imaging system of claim 1 wherein said imaging system is capable of forming full color images.

11. The imaging system of claim 1 wherein said imaging system is capable of forming monochromatic images.

12. The imaging system of claim 1 wherein said oil has a viscosity less than about 150 cps at 23° C.

13. The imaging system of claim 1 wherein said oil is capable of dissolving Crystal Violet Lactone in an amount greater than about 0.5 wt. percent at 23° C.

14. An imaging sheet comprising a photographic support, a layer of microcapsules on one surface of said support, said layer of microcapsules comprising a first plurality of microcapsules having a discrete capsule wall and containing a first internal phase which includes a chromogenic material and a photosensitive composition which undergoes a change in viscosity upon exposure to actinic radiation, and a second plurality of microcapsules having a discrete capsule wall and containing a second internal phase consisting essentially of an oil in which said chromogenic material is soluble, said oil having a viscosity less than the viscosity of said first internal phase; said imaging sheet being useful in forming images by image-wise exposing said imaging sheet to actinic radiation, assembling said imaging sheet with a developer sheet containing a developer composition on the surface thereof, and subjecting said microcapsules to a uniform rupturing force whereupon said first plurality of microcapsules image-wise releases said chromogenic material to said sheet carrying said developer composition, and said second plurality of microcapsules releases said second internal phase, said second internal phase thereupon mixing with said first internal phase and reducing the viscosity of said first internal phase and thereby enhancing image formation.

15. The imaging sheet of claim 14 wherein said photosensitive composition includes an ethylenically unsaturated compound.

16. The imaging sheet of claim 15 wherein said oil in which said chromogenic material is soluble is photosensitive.

* * * * *